(12) United States Patent
Minamio et al.

(10) Patent No.: US 7,202,469 B2
(45) Date of Patent: Apr. 10, 2007

(54) SOLID-STATE IMAGING DEVICE WITH MOLDED RESIN RIBS AND METHOD OF MANUFACTURING

(75) Inventors: Masanori Minamio, Takatsuki (JP); Kouichi Yamauchi, Takatsuki (JP); Katsutoshi Shimizu, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 41 days.

(21) Appl. No.: 10/970,533

(22) Filed: Oct. 21, 2004

(65) Prior Publication Data

US 2005/0109926 A1    May 26, 2005

(30) Foreign Application Priority Data

Oct. 23, 2003   (JP)   ............... 2003-363608

(51) Int. Cl.
*H01J 40/14*   (2006.01)
(52) U.S. Cl. .................. 250/239; 257/434; 438/65
(58) Field of Classification Search ............. 250/239; 257/433, 434, 676; 438/64, 65
See application file for complete search history.

(56) References Cited

U.S. PATENT DOCUMENTS

| | | | |
|---|---|---|---|
| 5,436,492 A * | 7/1995 | Yamanaka | 257/433 |
| 5,905,301 A * | 5/1999 | Ichikawa et al. | 257/676 |
| 5,998,862 A * | 12/1999 | Yamanaka | 257/704 |
| 6,130,448 A | 10/2000 | Bauer et al. | 257/222 |
| 6,730,991 B1 * | 5/2004 | Douglas | 257/625 |
| 2001/0020738 A1 | 9/2001 | Iizima et al. | 257/680 |
| 2003/0193018 A1 * | 10/2003 | Tao et al. | 250/239 |

FOREIGN PATENT DOCUMENTS

| | | |
|---|---|---|
| JP | 5-267629 | 10/1993 |
| JP | 2001-257334 | 9/2001 |
| JP | 2002-373950 | 12/2002 |

OTHER PUBLICATIONS

Korean Office Action for the corresponding Korean application: 10-2004-0084418, mailed Nov. 30, 2006.

* cited by examiner

*Primary Examiner*—Thanh X. Luu
(74) *Attorney, Agent, or Firm*—Hamre, Schumann, Mueller & Larson, P.C.

(57) ABSTRACT

A solid-state imaging device includes a wiring board composed of an insulating resin, frame-shaped ribs arranged on the wiring board, a transparent plate arranged on an upper surface of the ribs, a plurality of wiring members that electrically lead from an internal space of a case formed by the wiring board and the ribs to the outside, an imaging element fixed on the wiring board within the internal space, and connecting members which connect electrodes of the imaging element and the wiring members. The ribs are formed by resin molding directly onto a face of the transparent plate, and a lower surface of the ribs is fixed to the wiring board with an adhesive. The package is configured without adhesive interposed between the ribs and the transparent sealing plate, thereby reducing the effect on incident light.

13 Claims, 3 Drawing Sheets

SOLID-STATE IMAGING DEVICE WITH MOLDED RESIN RIBS AND METHOD OF MANUFACTURING

FIELD OF THE INVENTION

The present invention relates to solid-state imaging devices in which an imaging element, such as a CCD or the like, is mounted in a case, as well as to methods for manufacturing the same.

BACKGROUND OF THE INVENTION

Solid-state imaging devices, which are used widely for video cameras and still cameras or the like, are provided in the form of a package, in which an imaging element, such as a CCD or the like, is mounted on a base made of an insulating material, with the photo detecting region being covered by a transparent plate. In order to make the device more compact, the imaging element is mounted on the base as a bare chip. FIG. 6 shows the solid-state imaging device disclosed in JP H5-267629A, which is a conventional example of such a solid-state imaging device.

In FIG. 6, numeral 21 denotes a base, on the upper surface of which a recessed portion is formed, and in the center of the recessed portion an imaging element chip 22 is fixed. Lead terminals 24 are provided on the base 21, and lead pads 25 and bonding pads 23 of the imaging element chip 22 are connected by bonding wires 26 made of metal. Furthermore, ribs 28 are provided on an upper surface of the outer peripheral portion of the base 21, with a transparent sealing glass plate 27 fixed to the upper portion thereof, thus forming the package for protection of the imaging element chip 22.

Such a solid state imaging device is mounted on a circuit board with the sealing glass plate 27 facing upward, as shown in the figure, and the lead terminals 24 are used to connect it to the electrodes on the circuit board. Although not illustrated, a lens barrel incorporating an imaging optical system is mounted on top of the sealing glass plate 27 so that the relative positioning with respect to the photo detecting region formed in the imaging element chip 22 is adjusted with a predetermined precision. During the imaging operation, object light that has passed through the imaging optical system incorporated in the lens barrel is focused on the photo detecting region and photoelectrically converted.

In the conventional example of the solid-state imaging device described above, the sealing glass plate 27 is fixed with an adhesive to the upper surface of the ribs 28. Consequently, it is difficult to avoid the protrusion of some adhesive onto the inside face of the sealing glass plate 27 on the inner side of the ribs 28. Thus, there is the possibility of detrimental effects on the light that is incident on the photo detecting region of the imaging element chip 22, because the protruding adhesive blocks or scatters the incident light.

Furthermore, in the manufacturing step of the conventional solid-state imaging device, since the ribs 28 are formed in one piece with the base 21, it is inevitable that the sealing glass plate 27 is fixed by the adhesive to the upper surface of the ribs 28. Thus, as described above, it is difficult to avoid the effect of adhesive protrusion.

SUMMARY OF THE INVENTION

It is an object of the present invention to provide a solid-state imaging device whose package is configured such that no adhesive is interposed between the ribs and the transparent plate, which may be a sealing glass plate, thereby reducing the effect on incident light. It is another object of the present invention to provide a manufacturing method of mass-producing solid-state imaging devices with this type of structure easily.

A solid-state imaging device according to the present invention includes a wiring board composed of an insulating resin, frame-shaped ribs arranged on the wiring board, a transparent plate arranged on an upper surface of the ribs, a plurality of wiring members that electrically lead from an internal space of a case formed by the wiring board and the ribs to the outside, an imaging element fixed on the wiring board within the internal space, and connecting members that connect electrodes of the imaging element and the wiring members. The ribs are formed by resin molding directly onto a face of the transparent plate, and a lower surface of the ribs is fixed to the wiring board with an adhesive.

A method for manufacturing a solid-state imaging device according to the present invention is a method for manufacturing the device with the above-described configuration. The method includes: resin molding rib forming members for forming a plurality of the ribs constituting a plurality of the solid-state imaging devices onto a face of the transparent plate having a region corresponding to the plurality of the solid-state imaging devices; using a wiring board member in which a plurality of the wiring members are arranged in regions corresponding to a plurality of wiring boards, and fixing imaging elements inside the regions corresponding to the respective wiring boards and connecting the electrodes of the imaging elements and the wiring members by the connecting members; fixing the rib forming members to the surface of the wiring board member using an adhesive, with the rib forming members facing the wiring board member and the transparent plate opposing the wiring board member such that the imaging elements are arranged within frames formed by the rib forming members; and separating the solid-state imaging devices into pieces by cutting the wiring board member, the rib forming members and the transparent plate.

DESCRIPTION OF THE PREFERRED EMBODIMENTS

According to the configuration of a solid-state imaging device of the present invention, ribs for forming a case are directly resin molded to a face of a transparent plate, without the interposition of an adhesive between them. Consequently, the effect on incident light due to an adhesive protruding inside of the ribs can be avoided, thereby obtaining a favorable light receiving state.

In the solid-state imaging device of the present invention, it is preferable that an end face of a wiring board, an outer lateral face of the ribs and an end face of the transparent plate form a flush surface that is perpendicular to the surface of the wiring board. Furthermore, it is preferable that the internal lateral face of the ribs has an inclination, such that the width of the ribs becomes smaller on the wiring board side. Thus, the inside lateral face of the ribs stands up from the wiring board with a reverse taper, thereby suppressing substantially detrimental effects on the imaging function caused by the reflection of incident light by the internal lateral face of the ribs. In this case, the angle of inclination of the ribs may be in a range of 2 to 12° with respect to a direction perpendicular to the surface of the wiring board.

With the method for manufacturing a solid-state imaging device of the present invention, it is possible to fabricate easily a structure in which no adhesive is interposed between the ribs and the transparent plate.

In the method for manufacturing the solid-state imaging device according to the present invention, the rib forming members may be formed into a lattice shape, and when cutting the wiring board member and the transparent plate, the rib forming members may be cut in such a direction that the width of the rib forming members is divided into two. Thus, the ribs become half the width of the rib forming members, which is advantageous for miniaturization. Furthermore, by cutting the base, the rib forming members and the transparent plate together, the end face of the wiring board, the lateral face of the rib forming members and the end face of the transparent plate are substantially flush, thereby obtaining a favorable degree of flatness.

Furthermore, when resin molding the rib forming members on the face of the transparent plate, a lateral face of the rib forming members may be formed with an inclination, such that the width of the rib forming members becomes smaller with increased distance from the face of the transparent plate. Thus, it is easy to apply a reverse taper to the lateral face of the ribs after completion.

Embodiments of the present invention are explained in further detail below with reference to the drawings.

Embodiment 1

Figure 1:
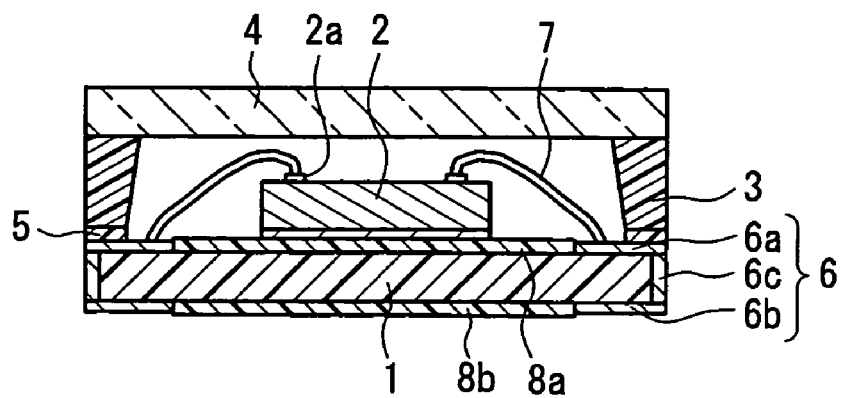
FIG. 1 is a cross-sectional view showing a configuration of a solid-state imaging device in accordance with Embodiment 1 of the present invention.
Figure 2:
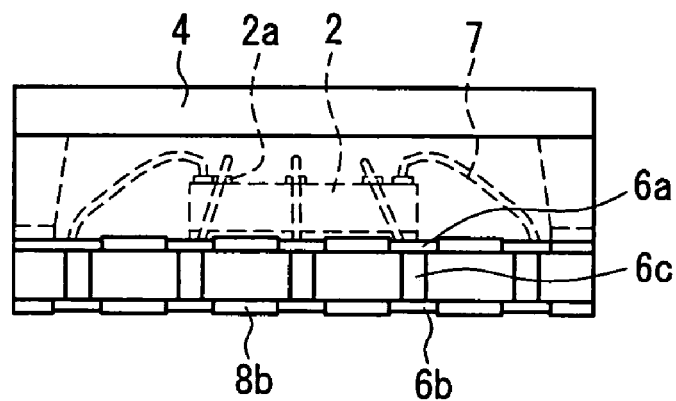
FIG. 2 is a lateral view of the solid-state imaging device of FIG. 1.
Figure 3:
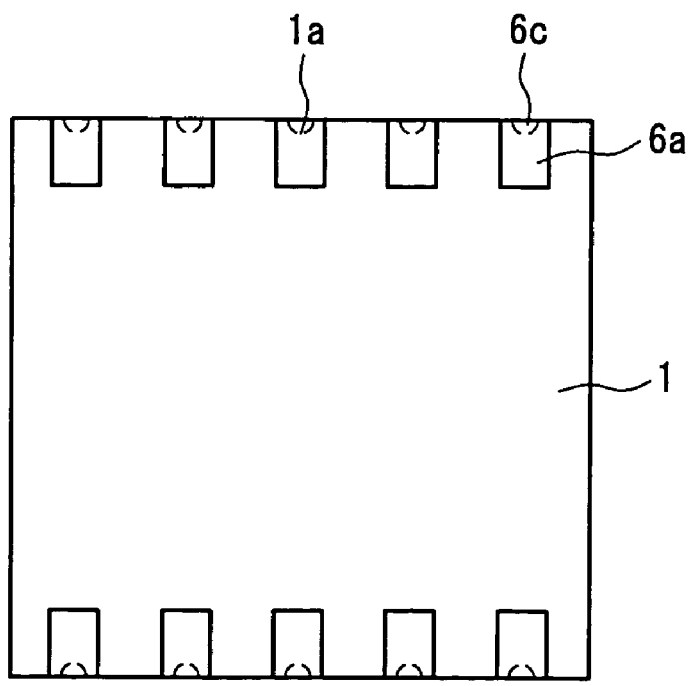
FIG. 3 is a bottom view of the solid-state imaging device of FIG. 2.

FIG. 1 is a cross-sectional view and FIG. 2 is a lateral view of a solid-state imaging device according to Embodiment 1. FIG. 3 is a diagram showing the bottom surface in FIG. 2.

A wiring board 1 has a flat planar shape, and is made of an insulating resin used for ordinary wiring boards, such as glass epoxy resin. An imaging element 2 is fixed on the wiring board 1, and ribs 3 shaped like a rectangular frame when viewed from above are provided on the wiring board 1 so as to surround the imaging element 2. The ribs 3 are made of, for example epoxy resin, and have a height of 0.3 to 1.0 mm for example. A transparent plate 4 is provided on an upper surface of the ribs 3. The ribs 3 are directly resin molded on one surface of the transparent plate 4, and are formed in one piece with the transparent plate 4. Consequently, a lower surface of the ribs 3 is fixed with an adhesive 5 onto the wiring board 1. Thus, a package having an internal space is formed by the wiring board 1, the ribs 3 and the transparent plate 4, and a plurality of wiring members 6 are arranged for connecting electrically the internal space to the outside. The wiring members 6 and the pad electrodes 2a of the imaging element 2 are connected by thin metal wires 7 within the space of the package. The total thickness of the package is ordinarily not more than 2.0 mm.

The wiring members 6 are composed of internal electrodes 6a formed on the face on which the imaging element 2 is mounted, external electrodes 6b formed on a rear face thereof, and end face electrodes 6c formed on the end faces of the wiring board 1. The external electrodes 6b are arranged in a position corresponding to the internal electrodes 6a. The end face electrodes 6c connect the internal electrodes 6a with the external electrodes 6b. It is possible to form any of the internal electrodes 6a, the external electrodes 6b or the end face electrodes 6c by plating, for example. As shown in FIG. 3, the end face electrodes 6c are arranged in recessed portions 1a, formed in an end face of the wiring board 1. Surfaces of the end face electrodes 6c are formed substantially flush with the end face of the wiring board 1, or are indented further than the end face of the wiring board 1.

Insulating films 8a and 8b are formed in the region surrounding the internal electrodes 6a and the external electrodes 6b on both faces of the wiring board 1 (FIG. 3 does not illustrate the insulating film 8b). A surface of the external electrodes 6b may be indented more than the surface of the insulating film 8b as shown in the figure, or it may be formed substantially flush with the surface of the insulating film 8b. The insulating film 8b and the external electrodes 6b may be arranged such that they have no overlapping portions, but it is also possible to arrange the peripheral portion of the external electrodes 6b such that it overlaps with the insulating film 8b.

An end face of the wiring board 1, an external lateral face of the ribs 3 and an end face of the transparent plate 4, that correspond to a lateral face of the package, are substantially flush, and form a flat lateral face of the package. This lateral face of the package can be formed with a favorable degree of flatness by cutting, in a single step, the end face of the wiring board 1, the lateral face of the ribs 3 and the end face of the transparent plate 4. Furthermore, the internal lateral face of the ribs 3 has an inclination with respect to the face of the wiring board 1. That inclination is set such that the internal space expands towards the wiring board 1. The angle of inclination is in a range of 2 to 12° with respect to a direction perpendicular to the face of the wiring board 1. This inclination is provided to suppress undesirable reflections of incident light by the internal lateral face of the ribs 3. In order to reduce further the effect of reflections by the internal lateral face of the ribs 3, it is possible to form a matte or grainy finish on the internal lateral faces of the ribs 3.

According to the configuration given above, the ribs 3 are directly resin molded to a surface of the transparent plate 4, and there is no adhesive interposed between them. Consequently, there is no adhesive protruding on the inner face of the transparent plate 4 on the inner side of the ribs 3, as in the case when fixing with an adhesive, so that the detrimental effect on incident light can be avoided, and it is possible to achieve favorable light reception.

Embodiment 2

Embodiment 2 is a method for manufacturing the solid-state imaging device with the structure shown in Embodiment 1, and is explained with reference to FIGS. 4 and 5.

Figure 4A:
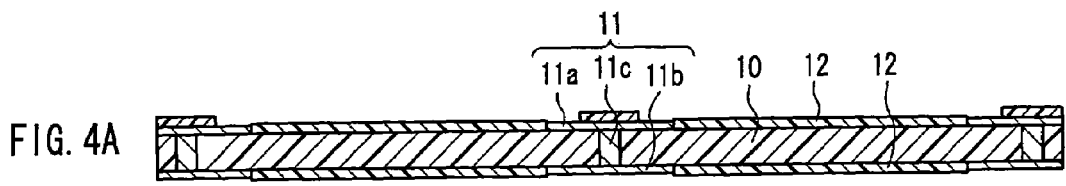
FIGS. 4A to 4F are cross-sectional views illustrating a method for manufacturing a solid-state imaging device according to Embodiment 2 of the present invention.
Figure 5:
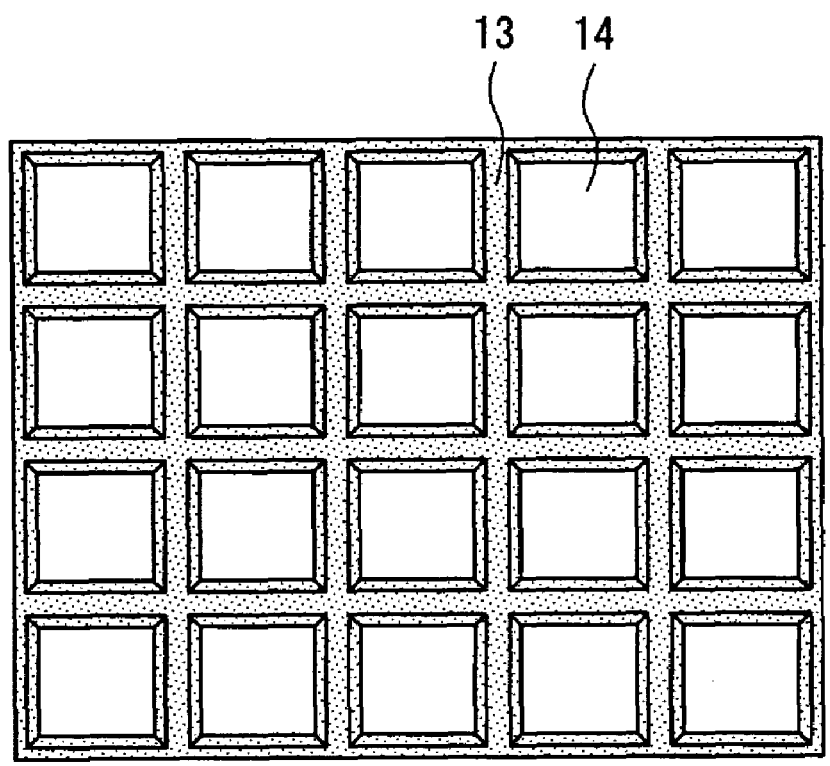
FIG. 5 is a top plan view of the rib forming members in the same manufacturing method.
Figure 6:
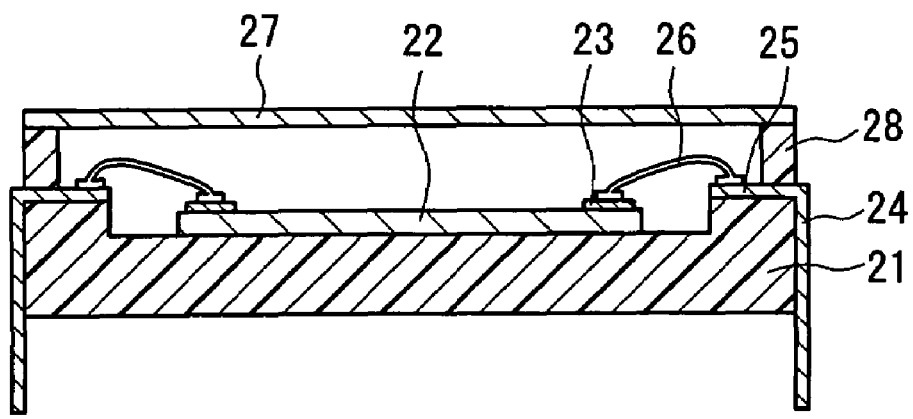
FIG. 6 is a cross-sectional view of a conventional solid-state imaging device.

First, a plate-shaped base material 10 made from an insulating resin is prepared as shown in FIG. 4A. Wire forming members 11 for forming wiring members 6 (see FIG. 1) are formed on partial regions of the base material 10, and insulating films 12 are formed on the upper and lower faces of the remaining region. The wire forming members 11 include an upper face conducting layer 11a and a lower face conducting layer 11b, formed respectively on the upper and lower faces of the base material 10. The upper face conducting layer 11a and the lower face conducting layer 11b are arranged in positions that correspond to each other in a vertical direction, and are connected by a through conducting layer 11c, which is formed through the base material. These conducting layers can be formed using any ordinary method. For example, it is possible to form a through hole in the base material 10, forming the through conducting layer 11c by plating, then form the upper face conducting layer 11a and the lower face conducting layer 11b by plating, adjusting them to the positions of the through conducting layer 11c.

The base material 10 is of a size large enough to form a plurality of solid-state imaging devices (FIG. 4 illustrates only a portion). A plurality of the wire forming members 11 are formed, in correspondence with the plurality of solid-state imaging devices.

Figure 4B:
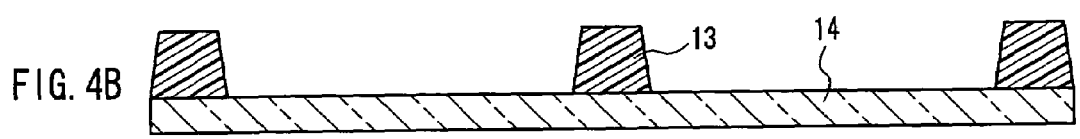

Next, as shown in FIG. 4B, rib forming members 13 are directly formed by resin molding without the use of adhesive onto a transparent plate 14, which has an area corresponding to the base material 10. The rib forming members 13 form a border between the regions corresponding to the solid-state imaging devices, and ultimately become the ribs 3 (see FIG. 1) of the solid-state imaging devices. As for the cross-sectional shape of the rib forming members 13, the lateral faces have an inclination such that the width narrows away from the transparent plate 14. FIG. 5 shows an example of a shape, viewed from above, of the rib forming members 13 that are resin formed in a lattice shape on the transparent plate 14. When forming the rib forming members 13 by resin molding, it is possible to suppress the generation of resin flash burrs by interposing for example a polyimide sheet between the resin molding mold and the transparent plate 14.

Figure 4C:
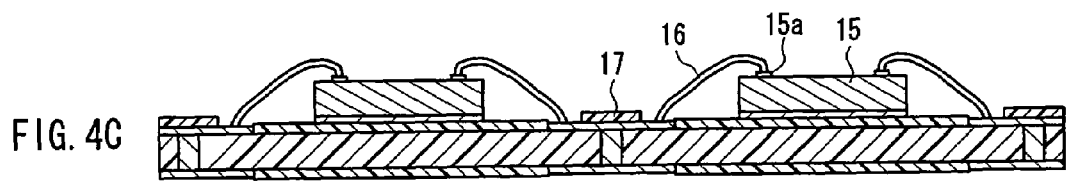
Figure 4D:
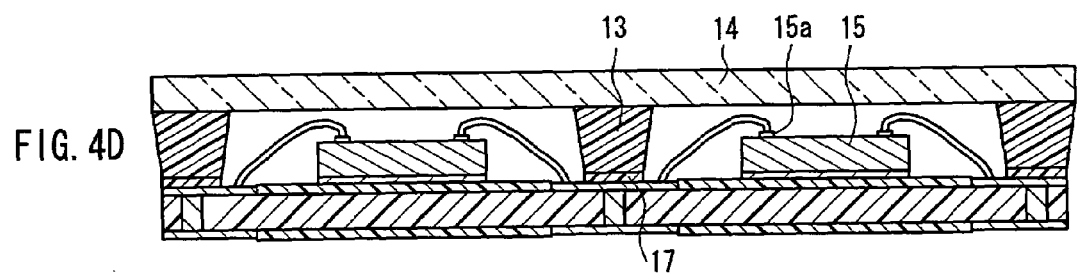

Next as shown in FIG. 4C, imaging elements 15 are fixed in the region corresponding to the solid-state imaging devices, and the pad electrodes 15a of the imaging elements 15 and the upper face conducting layers 11a are connected with thin metal wires 16. Furthermore, an adhesive 17 is coated onto a face on the base material 10 corresponding to the rib forming members 13. Next, as shown in FIG. 4D, the transparent plate 14 is mounted onto the base material 10 with the rib forming members 13 facing down, and joined with the lower surface of the rib forming members 13 abutting the adhesive 17.

Figure 4E:
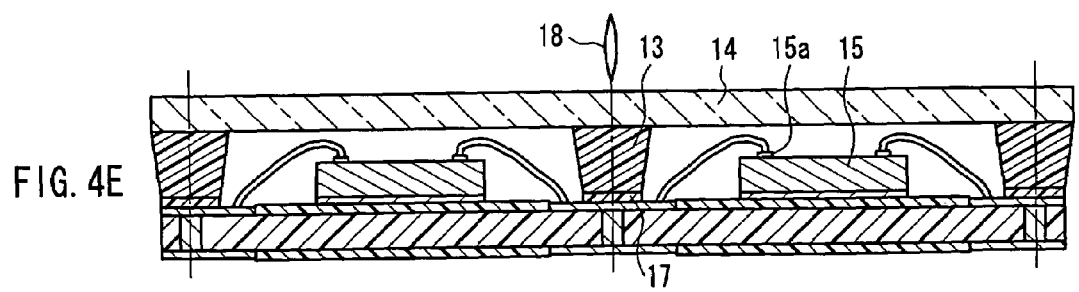
Figure 4F:
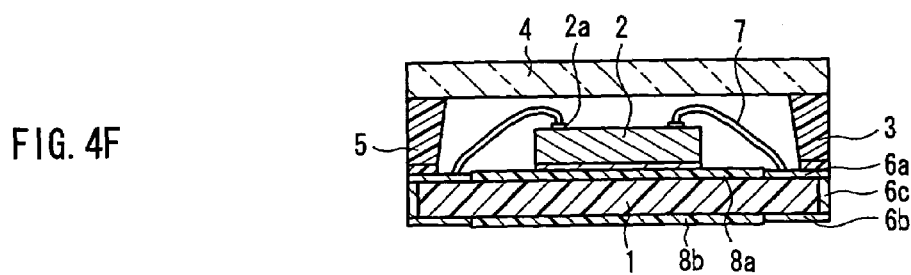

Next, the base material 10, the rib forming members 13 and the transparent plates 14 are cut with a dicing blade 18 as shown in FIG. 4E, and the pieces forming the solid-state imaging devices are separated as shown in FIG. 4F. As shown in FIG. 4E, the cutting is in a direction that is perpendicular to the base 10 and divides the width of the rib forming members 13 into two, when viewed from above. As a result, the rib forming members 13, the upper face conducting layers 11a, the lower face conducting layers 11b and the through conducting layers 11c are divided into two, forming the ribs 3, the internal electrodes 6a, the external electrodes 6b and the end face electrodes 6c of each individual solid-state imaging device.

According to this manufacturing method, it is possible to fabricate easily a structure in which no adhesive is interposed between the ribs 3 and the surface of the transparent plate 4. Furthermore, by cutting together the base 10, the rib forming members 13 and the transparent plate 14, the plane that forms the end face of the wiring board 1, the lateral face of the ribs 3 and the end face of the transparent plate 4 is substantially flush, and a favorable degree of flatness can be obtained. Because the lateral surface of the package is flat, when mounting the lens barrel containing the optical system, it is possible to maintain a high degree of precision in positioning the lens barrel by abutting the internal face of the lens barrel to lateral face of the package. Furthermore, it is possible to use a simple wiring board as the wiring board 1, thereby enabling the package to be formed compact and at low cost.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A solid-state imaging device comprising:
   an integrated member composed of a transparent plate and ribs made of a material different from that of the transparent plate, in which an upper surface of the ribs is resin molded onto the transparent plate;
   a wiring board fixed to a lower surface of the ribs;
   a plurality of wiring members that electrically lead from an internal space of a case formed by the wiring board and the ribs to the outside;
   an imaging element fixed on the wiring board within the internal space; and
   connecting members that connect electrodes of the imaging element and the wiring members.

2. The solid-state imaging device according to claim 1, wherein an end face of the wiring board, an external lateral face of the ribs and an end face of the transparent plate form a flush.

3. The solid-state imaging device according to claim 1, wherein an internal lateral face of the ribs is inclined such that a width of the ribs becomes smaller on the wiring board side.

4. The solid-state imaging device according to claim 3, wherein an inclination angle of the ribs is in a range of 2 to 12° with respect to a direction perpendicular to a surface of the wiring board.

5. The solid-stale imaging device according to claim 1, wherein each of the wiring members is composed of an internal electrode formed inside the case, an external electrode fanned outside the case, and an end face electrode connecting the internal electrode with the external electrode, and
   the surface of the end face electrode is from flush with the end face of the wiring board.

6. The solid-state imaging device according to claim 1, wherein each of the wiring members is composed of an internal electrode formed inside the case, an external electrode formed outside the case, and an end face electrode connecting the internal electrode with the external electrode, and
   the surface of the end face electrode is indented from the end face of the wiring board.

7. The solid-state imaging device according to claim 1, wherein the lower surface of the ribs is fixed to the wiring board with an adhesive.

8. The solid-state imaging device according to claim 1, wherein the integrated member is devoid of adhesive between the ribs and the transparent plate.

9. The solid-state imaging device according to claim 1, wherein an internal lateral face of each rib is matted to suppress reflections by the internal lateral faces of the ribs.

10. A method for manufacturing a solid-state imaging device comprising a wiring board composed of an insulating resin, frame-shaped ribs arranged on the wiring board, a transparent plate arranged on an upper surface of the ribs, a plurality of wiring members that electrically lead from an internal space of a case form by the wiring board and the ribs to the outside, an imaging element fixed on the wiring board within the internal space, and connecting members that connect electrodes of the imaging element and the wiring members, the method comprising:

resin molding rib forming members made of a material different from that of the transparent plate for forming a plurality of the ribs constituting a plurality of the solid-state imaging devices onto a face of the transparent plate having a region corresponding to the plurality of the solid-state imaging devices;

using a wiring board member in which a plurality of the wiring members are arranged in regions corresponding to a plurality of wiring boards, and fixing imaging elements inside the regions corresponding to the respective wiring boards and connecting the electrodes of the imaging elements and the wiring members by the connecting members;

fixing the rib forming members to the surface of the wiring board member using an adhesive, with the rib forming members facing the wiring board member and the transparent plate opposing the wiring board member such that the imaging elements are arranged within frames formed by the rib forming members; and separating the solid-state imaging devices into pieces by cutting the wiring board member, the rib forming members and the transparent plate.

11. The method for manufacturing a solid-state imaging device according to claim 10, wherein the rib forming members are formed into a lattice shape, and when cutting the wiring board member and the transparent plate, the rib forming members are cut in such a direction that a width of the rib forming members is divided into two.

12. The method for manufacturing a solid-state imaging device according to claim 11, wherein, when resin molding the rib forming members on the face of the transparent plate, a lateral face of the rib forming members is formed with an inclination, such that the width of the rib forming members becomes smaller with increased distance from the face of the transparent plate.

13. The method for manufacturing a solid-state imaging device according to claim 10, wherein an internal lateral face of each rib is matted to suppress reflections by the internal lateral faces of the ribs.

* * * * *